INVENTOR
HERMANN G. GRIMMEISS
BY
Frank R. Trifari
AGENT

INVENTOR.
HERMANN G. GRIMMEISS
BY
Frank R. Jifari
AGENT

Dec. 10, 1968 H. G. GRIMMEISS 3,415,996

PHOTOSENSITIVE SEMICONDUCTOR WITH TWO RADIATION SOURCES FOR PRODUCING TWO TRANSITION STEPS

Filed Feb. 15, 1965

3 Sheets-Sheet 3

INVENTOR.

HERMANN G. GRIMMEISS

BY

Frank R. Trifari

AGENT

United States Patent Office 3,415,996

Patented Dec. 10, 1968

3,415,996

PHOTOSENSITIVE SEMICONDUCTOR WITH TWO RADIATION SOURCES FOR PRODUCING TWO TRANSITION STEPS

Hermann Georg Grimmeiss, Aachen, Germany, assignor to North American Philips Company, Inc., New York, N.Y., a corporation of Delaware Filed Feb. 15, 1965, Ser. No. 433,259
10 Claims. (Cl. 250—217)

ABSTRACT OF THE DISCLOSURE

A detector for radiation comprising a photosensitive semiconductor having a deep lying impurity level in its forbidden gap forming two transition steps for electrons from the valence to the conduction band. The semiconductor is exposed to the radiation to be detected which is capable of causing one of the transition steps while simultaneously being irradiated with an auxiliary radiation capable of producing the other transition step in order to move the electrons into the conduction band in two steps to thereby cause a change in current in an output circuit indicative of the intensity of the incident radiation to be detected. Among the advantages are a sensitivity to long wavelength radiation and larger electrical outputs.

The invention relates to an arrangement for the detection of radiation, which device comprises a radiation detector including a photosensitive semiconductor body to which the radiation to be detected is supplied.

The photosensitive semiconductor body may be provided with two electrodes and serve as a photoresistance element, that is to say, as a resistance element the electric resistance of which is decreased by irradiation.

The photosensitive semiconductor body may also be designed as a photovoltaic cell in which the photosensitive semiconductor body includes a p-n junction on either side of which an electrode is provided. The radiation to be detected falls on the semiconductor body near the p-n junction, usually within a distance therefrom equal to a few diffusion lengths of the free charge carriers in the semiconductor body, and produces an electric voltage at the electrodes and/or an electric current in an external circuit between these electrodes.

A p-n junction may also be biased in the reverse direction, the current produced by the incident radiation being measured.

For the detection of radiation free charge carriers must be generated in the photosensitive semiconductor body by the radiation to be detected. This may be effected, for example, by electrons being brought from the valence band to the conduction band by the incident radiation. In this process not only free electrons in the conduction band but also free holes in the valence band are obtained so thatt he semiconductor body may take the form of a photovoltaic cell.

It should be noted that to enable radiation to be detected by means of a photovoltaic cell the radiation to be detected must generate both free electrons and holes, whereas for a photoresistance cell it is sufficient that either free electrons or holes are generated.

Consequently only radiation having wavelengths corresponding to energies equal to or exceeding the width of the forbidden band between the valence band and the conduction band can be detected. In many cases this means an undesirable limitation of the spectral sensitivity of the photosensitive semiconductor body.

In a photovoltaic cell in which the photosensitive semiconductor body includes an n-type region which adjoins a p-type region the spectral sensitivity of the photosensitive semiconductor body in some cases also covers a small range of wavelengths which correspond to energies smaller than the width of the forbidden band, and this range of wavelengths adjoins the range of wavelengths which correspond to energies greater than the width of the forbidden band. This is due to the fact that the n-type region includes donor levels situated close to the conduction band while for substantially each donor level due to thermal energy an electron is present in the conduction band. In some cases it is possible to bring an electron by optical agency, that is to say, by incident radiation, from the valence band to a donor level while, since the donor level is situated close to the valence band, the electron can readily be brought by thermal agency from the donor level into the valence band. The p-type region includes acceptor levels which are situated close to the valence band and substantially all of which are occupied by an electron owing to thermal energy. In some cases an electron can be brought by optical agency from an acceptor level to the valence band while the acceptor level due to thermal energy is occupied again by an electron from the valence band. In some known devices this possibility of bringing electrons from the valence band into the conduction band in two transition steps by way of a donor or acceptor level, one of these transition steps being optical and the other thermal, results in a small extension of the spectral sensitivity to greater wavelengths which correspond to energies smaller than the width of the forbidden band.

It has been proved that it is possible to extend the spectral sensitivity of the photosensitive semiconductor body over a larger range of wavelengths which correspond to energies smaller than the width of the forbidden band, by incorporating in the semiconductor body an impurity which results in an energy level by lying deep in the forbidden band, which impedes thermal transition of an electron from the valence band to this energy level or from this energy level to the valence band. With this arrangement electrons can be brought by optical agency from the valence band into the conduction band in two transition steps by way of the energy level deep in the forbidden band. Thus, the photosensitive semiconductor body is also sensitive to radiation of wavelengths which correspond to energies smaller than the width of the forbidden band and at least equal to the energy required to produce the greater transition step, for this radiation is also capable of producing the smaller transition step. This provides an appreciable extension of the spectral sensitivity of the photosensitive semiconductor body.

It is an object of the present invention to increase the sensitivity of the photosensitive semiconductor body to radiation at wavelengths corresponding to energies smaller than the width of the forbidden band.

It is an other object of the invention to cause the spectral sensitivity of the photosensitive semiconductor body to extend over a larger range of wavelengths corresponding to energies smaller than the width of the forbidden band.

According to the invention, a device for detecting radiation which comprises a radiation detector including a photosensitive semiconductor body to which the radiation to be detected is supplied is characterized in that the photosensitive semiconductor body contains a forbidden band in which an intermediate energy level is present resulting in that electrons can be brought by optical agency from the valence band to the conduction band by a first transition step from the valence band to the intermediate energy level and a second transition step from the intermediate energy level to the conduction band while there is supplied to the photosensitive semiconductor body an optical signal consisting of radiation of which at least a material part corresponds to the first transition step and also an optical signal consisting of radiation of which at least a material part corresponds to the second transition step, at least one of the optical signals being an optical signal to be detected. The term "radiation corresponding to a transition step" is to be understood to have the following meaning. Radiation corresponding to the larger of the two transition steps has a quantum energy smaller than the width of the forbidden band and at least equal to the energy required to give rise to the greater transition step. Radiation corresponding to the smaller transition step has a quantum energy smaller than the energy required for the larger energy step and at least equal to the energy required to produce the smaller transition step and consequently it can only produce the smaller transition step.

Surprisingly it has been found that the sensitivity of the photosensitive semiconductor body to radiation at wavelengths corresponding to energies smaller than the width of the forbidden band but sufficient to produce the larger transition step can be greatly improved by simultaneous irradiation by radiation which is capable only of producing the smaller transition step. In this manner a thrice greater sensitivity has already been obtained in experiments. Conversely, the photosensitive semiconductor body which in itself is not sensitive to radiation capable only of producing the smaller transition step can be rendered sensitive to this radiation by also irradiating the semiconductor body with radiation corresponding to the larger transition step.

The arrangement preferably includes a radiation source by which one of the optical signals is applied to the photosensitive semiconductor body, the other optical signal being detected. The radiation source may be an injection recombination radiation source and advantageously the injection recombination radiation source and the photosensitive semiconductor body may have a common semiconductor body. This permits a very compact construction. It should be noted that the common semiconductor body at the location of the recombination radiation source may consist of an other semiconductor material than at the area of the photosensitive semiconductor body.

According to the invention an important embodiment of an arrangement for detecting radiation is characterized in that the radiation source irradiates the photosensitive semiconductor body substantially continuously with radiation of which at least a material part corresponds to the larger of the two transition steps while the optical signal to be detected consists, at least for a material part, of radiation corresponding to the smaller of the two transition steps. This arrangement utilizes the fact that the photosensitive semiconductor body is rendered suitable to detect radiation capable only of producing the smaller transition step by irradiation with radiation capable of producing the larger transition step. Thus, in principle the radiation source is used as an auxiliary radiation source, resulting in a radiation detector which, in addition to a spectral sensitivity to radiation of wavelengths corresponding to energies exceeding the width of the forbidden band, has a spectral sensitivity to radiation of wavelengths corresponding to energies smaller than the width of the forbidden band and at least equal to the energy required for the smaller transition step. Thus the photosensitive semiconductor body may, for example, have a spectral sensitivity which extends from visible light to infrared radiation having a wavelength of about $2/\mu$.

Another important embodiment of the arrangement according to the invention is characterized in that the radiation source irradiates the photosensitive semiconductor body substantially continuously with radiation of which at least a material part corresponds to the smaller of the two transition steps while the optical signal to be detected consists, at least for a material part, of a radiation corresponding to the larger of the two transition steps. This embodiment utilises the fact that the sensitivity of the photosensitive semiconductor body to radiation which is capable of producing the larger transition step and has wavelengths which correspond to energies smaller than the width of the forbidden band can be considerably increased by irradiation with radiation which is capable only of producing the smaller transition step.

In a radiation detector according to the invention electrons can be brought by optical agency from the valence band to the conduction band by way of the intermediate energy level. In this process free charge carriers are produced in the form of electrons in the conduction band and in the form of holes in the valence band. Consequently the photosensitive semiconductor body may advantageously be designed as a photovoltaic cell, and a further important embodiment of an arrangement according to the invention is characterized in that the photosensitive semiconductor body contains a p-n junction This embodiment also has the important advantage that the radiation to be detected, which is capable of producing the larger transition step or only the smaller transition step, is detected in a photosensitive semiconductor body which contains a p-n junction and in which the width of the forbidden band exceeds the quantum energies which correspond to the wavelengths of the radiation to be detected. In known devices for detecting the same radiation by means of a photosensitive semiconductor body containing a p-n junction, generally a semiconductor body is used in which the width of the forbidden band is equal to, or smaller than, the quantum energies which correspond to the wavelengths of the radiation to be detected so that the radiation to be detected is capable of bringing electrons directly from the valence band into the conduction band. Since the photovoltage obtainable at the electrodes of a semiconductor body containing a p-n junction increases with increase in the width of the forbidden band, in a device according to the invention a higher photovoltage is obtainable in detecting the said radiation. Furthermore, if the photosensitive semiconductor body is to be operated with a bias which biasses the p-n junction in the reverse direction, the fact that the maximum reverse voltage in the reverse direction also increases with increasing width of the forbidden band enables a larger bias voltage to be applied and a larger output in the case of a detector according to the invention.

The distance between the intermediate level and the valence band and the distance between the intermediate level and the conduction band preferably are so large that at the operating temperature no electrons are brought by thermal agency from the valence band to the intermediate level or from the intermidate level to the valence band, or at least so large that at the operating temperature the number of electrons which owing to thermal energy are brought from or to the intermediate level is so small as to have no significant disturbing influence upon the detection of the desired radiation.

Assuming the operating temperature to be room temperature, the distance between the intermediate level and the valence band and the distance between the intermediate level and the conduction band preferably are at least 0.1 electron-volt.

Particularly satisfactory results have been obtained with a photosensitive semiconductor body of gallium phosphide which, at least at the location at which the radiation of the optical signals is mainly absorbed, is doped with zinc and oxygen.

If radiation is to be detected which is capable only of producing the smaller transition step, the radiation source may advantageously be an injection recombination radiation source having a semiconductor body which also consists of gallium phosphide which, at least near the p-n junction, is doped with zinc and oxygen and which may be integral with the photosensitive semiconductor body.

The expression "at least near the p-n junction" is to be understood to include "at least at one side of the p-n junction."

If radiation is to be detected of which a material part corresponds to the larger transition step, the radiation source may advantageously be an injection recombination radiation source having a semiconductor body of one of the semiconductor materials gallium arsenide and indium phosphide.

A photosensitive semiconductor body of aluminum phosphide may also be used to advantage. In not intentionally doped aluminum phosphide crystals in which the width of the forbidden band is approximately 2.42 electron-volts, the presence of a favourably situated intermediate level spaced from the valence band by about 0.37 electron-volt has been shown.

The invention also relates to a radiation detector for use in an arrangement for detecting radiation in accordance with the invention, which is characterized in that the radiation detector comprises a photosensitive semiconductor body having a forbidden band in which an intermediate energy level is present resulting in that electrons can be brought by optical agency from the valence band to the conduction band by a first transistion step from the valence band to the intermediate energy level and a second transition step from the intermediate energy level to the conduction band, the photosensitive semiconductor body being constructionally combined with a radiation source which is capable of supplying to the photosensitive semiconductor body an optical signal which consists, at least for a material part, of radiation corresponding to one of the two transition steps, while means are provided which enable radiation which is to be detected and corresponds to the other transition step to be supplied to the photosensitive semiconductor body. These means may consist, for example, of a window which is provided in a common envelope of the radiation source and the photosensitive semiconductor body and through which optical signals to be detected may strike the photosensitive semiconductor body.

In order that the invention may readily be carried into effect, embodiments thereof will now be described, by way of example, with reference to the accompanying diagrammatic drawings, in which.

Figure 1:
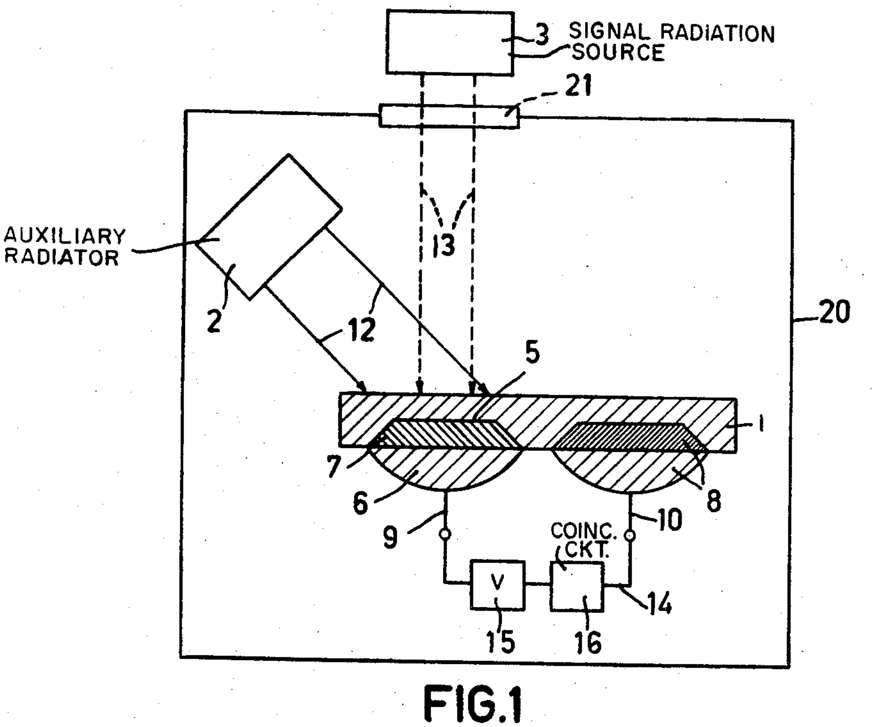
FIG. 1 shows schematically and partly in section an arrangement for detecting radiation according to the invention.

The arrangement for detecting radiation shown in FIG. 1 comprises a radiation detector having a photosensitive semiconductor body 1 to which radiation 13 to be detected is supplied. The photosensitive semiconductor body 1 has a forbidden band in which an intermediate energy level is present so that electrons can be brought by optical agency from the valence band to the conduction band in two transition steps by way of the intermediate energy level. Two optical signals 12 and 13 are applied to the photosensitive semiconductor body 1. One of these optical signals consists of radiation of which at least a material part corresponds to the smaller transition step, while the other optical signal consists of radiation of which at least a material part corresponds to the larger transition step. The optical signal 13 is the signal to be detected.

The photosensitive semiconductor body 1 may consist, for example, of gallium phosphide doped with zinc and oxygen. Another suitable semiconductor material is, for example, aluminum phosphide.

Figure 2:
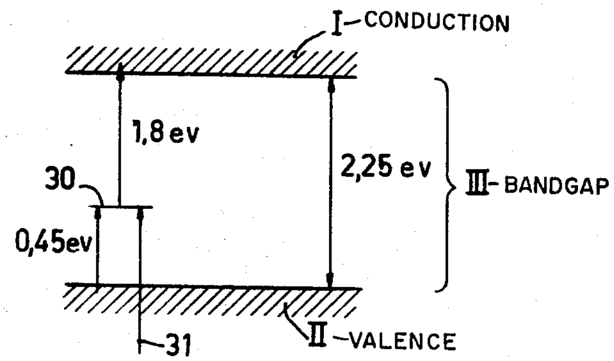
FIG. 2 is an energy diagram of a photosensitive semiconductor body as used in the device shown in FIG. 1.

Gallium phosphide doped with zinc and oxygen proves to have a forbidden band III which has a width of approximately 2.25 electron-volts and includes an intermediate energy level 30 (FIG. 2) at a distance of about 0.45 electron-volt from the valence band II. Thus the energy required for the smaller transition step is at least approximately 0.45 electron-volt and the energy required to produce the larger transition step is at least approximately 1.8 electron-volts. Hence radiation corresponding to the smaller transition step in this case has a quantum energy lying in the range between approximately 0.45 electron-volt and approximately 1.8 electron-volts, and radiation corresponding to the larger transition step has a quantum energy lying in the range between approximately 1.8 electron-volts and approximately 2.25 electron-volts.

It should be noted that the intermediate level in the forbidden band III of the photosensitive semiconductor body to be used preferably is spaced from the valence band II and also from the conduction band I by a distance of at least 0.1 electron-volt, since in this case there are no or substantially no inconvenient thermally produced transitions of electrons from the valence band to the intermediate level or from the intermediate level to the conduction band. The p-type gallium phosphide body 1, which is doped with zinc and oxygen, contains a p-n junction 5 obtained by alloying a tin contact 6 to the body so that an n-type recrystallized region 7 is produced. The gallium phosphide body is further provided with a substantially ohmic connecting contact 8.

The gallium phosphide body 1 provided with the contacts 6 and 8 is obtainable in the following manner.

1 gm. of gallium phosphide and 5 gm. of gallium containing approximately 0.1% by weight of zinc and approximately 0.2% by weight of oxygen are sealed in a quartz ampoule and heated to approximately 1200° C. for approximately 2 hours. The whole is then cooled to room temperature in approximately 4 hours and the contents are taken from the ampoule. These contents prove to consist of gallium which contains gallium phosphide crystals of approximately 3 mm. x 3 mm. x 0.2 mm. The p-type gallium phosphide crystals can be carefully separated from the gallium by mechanical means and any residual gallium can be removed from the crystals by boiling in hydrochloric acid (30%).

The tin contact 6, which has a diameter of approximately 0.5 mm., may be obtained by fusing tin onto the semiconductor body at a temperature of approximately from 400° C. to 700° C. during a period of time which preferably is less than 1 second. The connecting contact 8, which also has a diameter of approximately 0.5 mm., may be obtained by fusing gold containing approximately 4% by weight of zinc onto the semiconductor body under the same conditions. The contacts 6 and 8 may be provided with supply leads 9 and 10 in a manner commonly used in the semiconductor art.

The device shown in FIG. 1 includes a radiation source 2 for applying the optical signal 12 to the photosensitive semiconductor body.

The optical signal 13 to be detected is supplied by an arbittrary radiation source 3 which may be spaced from the photosensitive semiconductor body 1 by a large distance.

In an important embodiment the radiation source 2 irradiates the photosensitive semiconductor body 1 substantially continuously with radiation 12 which corresponds to the greater transition step (1.8 electron-volts) while the radiation 13, of which at least temporarily a material part consists of radiation which corresponds to the smaller transition step (0.45 electron-volt) and which is produced by the radiation source 3, is detected. The radiation source 2 serves as the auxiliary radiation source which renders the photosensitive semiconductor body 1 sensitive to the radiation 13 which is capable only of producing the smaller transition step. The radiation source 2 and the photosensitive semiconductor body 1 together constitute a radiation detector for the radiation 13. The wavelength of the radiation 12 is, for example, approximately 7000 A, which corresponds to a quantum energy of approximately 1.8 electron-volts while the radiation 13 to be detected mainly has a wavelength of, for example, approximately 1.2/$\mu$, which corresponds to approximately 1 electron-volt. As mentioned hereinbefore, in the embodiment under consideration, the radiation 13 to be detected may have a wavelength which corresponds to energies situated in the range between approximately 0.45 electron-volt and approximately 1.8 electron-volts, however, in view of the sensitivity of the photosensitive semiconductor body the device is particularly suited to the detection of radiation of a wavelength which corresponds to energies situated in the range between approximately 0.7 electron-volt and approximately 1.5 electron-volts.

Figure 3:
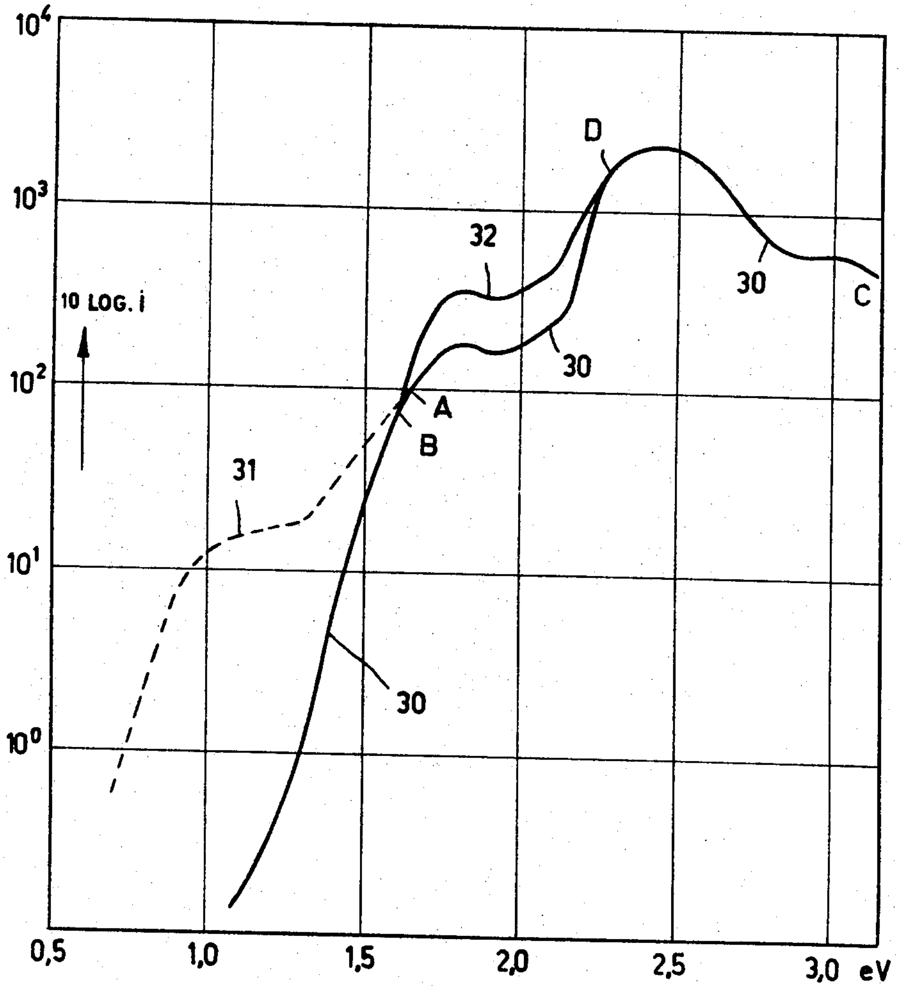
FIG. 3 is a graph showing the spectral sensitivity of a radiation detector according to the invention.

In FIG. 3 the short-circuit current $i$ in an external circuit 14 between the electrodes 9 and 10 of the photosensitive semiconductor body 1 is plotted logarithmically (to the base 10) in arbitrary units as a function of the wavelength of the incident radiation, which has been converted into electron-volts. Curve 30 shows the spectral sensitivity of the gallium phosphide body if no auxiliary radiation source is used. The gallium phosphide body 1 is sensitive to radiation having a wavelength which corresponds to energies smaller than the width of the forbidden band III (2.25 electron-volts) with a maximum at approximately 1.8 electron-volts (7000 A.). This radiation is capable of producing the larger transition step (1.8 electron-volts, see FIG. 2) and also the smaller transition step, in which electrons are brought from a deep lying level of the valence band 2 to the intermediate level 20 (cf. arrow 31 of FIG. 2).

When an auxiliary radiation source 2 (FIG. 1) is used which irradiates the gallium phosphide body 1 substantially continuously with radiation having a wavelength of approximately 7000 A., which radiation is capable of producing the larger transition step, the spectral sensitivity of the gallium phosphide body 1 is shown by curve 31 and the part AC of the curve 30 of FIG. 3. In this case the gallium phosphide body 1 is also sensitive to radiation which is capable only of producing the smaller transition step.

It should be noted that the radiation of 7000 A. produced by the auxiliary radiation source 2 already produces a photocurrent in the external short-circuit path 14 between the electrodes 9 and 10 (FIG. 1), as is also shown by the curve 30. This short-circuit current may be compensated for by a reverse voltage provided by a voltage source 15 connected in the external circuit 14 between the electrodes 9 and 10, so that the auxiliary radiation source 2 does not give rise to the flow of current in the external circuit 14. The spectral sensitivity of the gallium phosphite body 1 may then be measured by a known method, which results in curve 31 together with the part AC of curve 30. Also in this manner the arrangement may be operated during detection of the radiation 13 having an arbitrary wavelength within the range of the spectral sensitivity of the photosensitive body 1.

Consequently a radiation detector has been obtained which has a spectral sensitivity extending from shortwave visible light (blue) to infrared radiation having wavelengths of approximately 2$\mu$. If, for example, infrared radiation 13 is now detected which is capable of producing only the smaller transition step (0.45 electron-volt), the important advantage is obtained that this radiation is detected in a photosensitive semiconductor body 1 which contains a p-n junction and has a width of the forbidden band (for gallium phosphide approximately 2.25 electron-volts) which greatly exceeds the energy corresponding to the wavelength of the detected radiation. This also permits the production of a higher photovoltage between the electrodes 9 and 10 than if a semiconductor 1 were used which has a width of the forbidden band which is smaller than the energy corresponding to the wavelength of the radiation to be detected, since the obtainable photovoltage is substantially proportional to the width of the forbidden band. If a bias is to be applied to the electrodes 9 and 10 which biases the p-n junction 5 in the reverse direction, higher bias voltages may be used and hence higher powers may be derived as the width of the forbidden band in the photosensitive semiconductor body 1 increases. A larger width of the forbidden band also results in a smaller temperature sensitivity. Hence there is no objection to the use of the radiation detector described at room temperature when detecting infrared radiation.

The auxiliary radiation source 2 may be any radiation source capable of emitting radiation which has the desired wavelengths which correspond to energies at least equal to the energy required for the larger transition step (1.8 electron-volts) and smaller than the width of the forbidden band (2.25 electron-volts), for example, radiation having a wavelength of 7000 A. The radiation source 2 may, for example, be a tungsten ribbon lamp combined with a monochromatic filter, for example, an interference filter. Such filters are readily obtainable commercially.

The radiation source 2 preferably is combined with the photosensitive semiconductor body to form an integral structure, means being provided for applying to the photosensitive semiconductor body optical signals 13 to be detected. These means may, for example, be a window 21 provided in a common envelope which is shown schematically by a dot-dash line 20 in FIG. 1. Through the window 21 optical signals 13 to be detected may strike the photosensitive semiconductor body. The integral structure comprising the radiation source 2 and the photosensitive semiconductor body 1 in this case constitutes the radiation detector of the device of FIG. 1.

Figure 4:
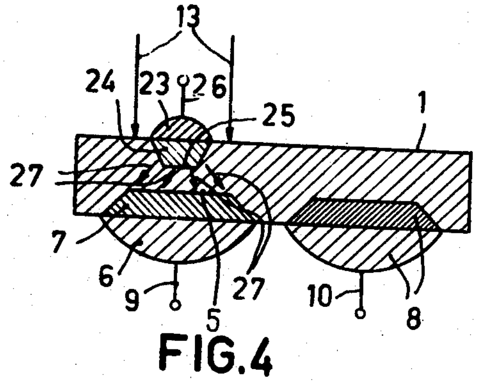
FIGS. 4 and 5 are schematic cross-sectional views of further embodiments of a radiation detector according to the invention.

The radiation source 2 may advantageously be a p-n recombination radiation source which comprises a semiconductor body of gallium phosphide which contains p-n junction and, at least near the p-n junction, is doped with zinc and oxygen and may be integral with the photosensitive semiconductor body 1. FIG. 4 shows such a structure. The radiation detector of FIG. 4 is largely similar to the photosensitive semiconductor body 1 provided with electrodes shown in FIG. 1, and hence corresponding parts are designated in FIGS. 1 and 4 by like reference numerals. The photosensitive semiconductor body 1 of FIG. 4 contains a second p-n junction 25 obtained by fusing a second tin contact 23 under conditions similar to those used in fusing the tin contact 6 so that a second recrystallized n-type region 24 is produced. The tin contact 23 is provided with a supply conductor 26 and preferably is smaller than the contact 6.

By applying a voltage between the supply conductors 26 and 10 a current in the forward direction may be passed through the p-n junction 25. As a result near this p-n junction 25 radiation 27 of a wavelength of about 7000 A. is produced by recombination of holes and electrons. This radiation can reach the proximity of the p-n junction 5, where it is absorbed. The photocurrent and/or photovoltage is taken from the conductors 9 and 10. The p-n junction 5 may be biased in the reverse direction. The radiation 12 of FIG. 1 corresponds to the radiation 27 of FIG. 4, and this radiation 27 is produced in the gallium phosphide body 1 itself so that the likelihood of inconvenient reflections at the surface of the semiconductor body 1 is reduced. The infrared radiation to be detected is again designated by the reference numeral 13.

It should be noted that the radiation 13 to be detected need not be capable of directly penetrating to the proximity of the photosensitive p-n junction 5. It has been found in practice that when this radiation 13 does not directly reach the proximity of p-n junction 5 it penetrates thereto by internal reflections within the body 1.

Figure 5:
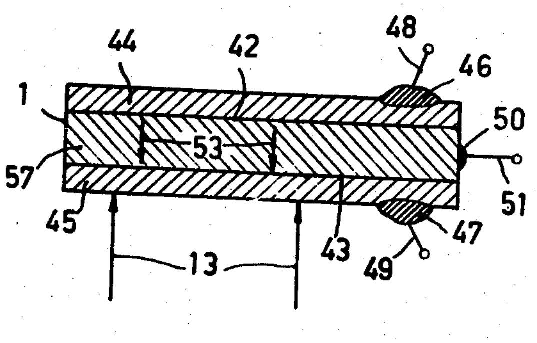

In the embodiments described with reference to FIGS. 1 and 4 the p-n junctions 5 and 25 are obtained by fusing the contacts 6 and 23 respectively onto the semiconductor body. Each or both of these p-n junctions may, however, be advantageously produced by means of diffusion and/or epitaxial processes commonly used in the semiconductor art. FIG. 5 shows schematically an embodiment provided with two p-n junctions 42 and 43 produced by diffusion.

The semiconductor body 1 contains two diffused zones 44 and 45 provided with connecting contacts 46 and 47 to supply leads 48 and 49, respectively. The intermediate zone 57, which is of a conductivity type opposite to that of the zones 44 and 45, is provided with a connecting contact 50 to a supply lead 51. A p-n junction 42 may be biased, for example, in the forward direction so that recombination radiation 53, which corresponds to the radiation 27 of FIG. 4 and the radiation 12 of FIG. 1, is obtained. The radiation 53 may be absorbed in the proximity of a p-n junction 43, where the radiation 13 to be detected may also be absorbed.

As mentioned hereinbefore, the curve 30 of FIG. 3 represents the spectral sensitivity of the gallium phosphide body 1 (FIG. 1) when no auxiliary radiation source is used. If an auxiliary radiation source 2 is used which emits radiation 12 capable of producing only the smaller transition step, for example, infrared radiation having a wavelength of approximately 1.2$\mu$, it is surprisingly found that the sensitivity of the gallium phosphide body to the radiation 13 to be detected, which radiation is capable of producing the larger transition step, increases. Hence the part BD of curve 30 must be replaced by curve 32. The sensitivity of this radiation 13, which may have a wavelength of, for example, 7000 A., may thus readily increase by a factor of 2 (for example, the short circuit current in the external circuit 14 of FIG. 1 may be doubled) while in experiments made in elaborating the invention a trebled sensitivity has frequently been found.

In a further important embodiment of the device for detecting radiation according to the invention the radiation source 2 (FIG. 1) irradiates the photosensitive semiconductor body 1 substantially continuously with radiation 12 of which at least a material part corresponds to the smaller of the two transition steps while the optical signal 13 to be detected consists, at least for a material part, of radiation corresponding to the larger of the two transition steps. The photosensitive semiconductor body 1 provided with the contacts 6 and 8 may consist of the same materials as are mentioned in the embodiment described with reference to FIG. 1.

The radiation 13 (which has a wavelength of, for example, approximately 7000 A.) is detected in a photosensitive semiconductor body 1 in which the width of the forbidden band exceeds the energy corresponding to the wavelength of the radiation 13 to be detected, so that the aforementioned advantages attendant on such an arrangement are again obtained.

It should be noted that irradiation of the photosensitive semiconductor body 1 with radiation 12 which in itself is capable of producing only the smaller transition step, does not give rise to a photocurrent and/or photovoltage.

The external circuit 14 may include an instrument 16 which gives an electrical and/or optical signal only at a photocurrent in the external circuit 14 which is, for example, twice as large as the photocurrent produced by irradiation with radiation 13 of a wavelength of, for example, 7000 A. In this case the instrument 16 gives a signal only if a radiation 12 capable of producing only the smaller transition step also strikes the photosensitive body 1. Thus a coincidence circuit is obtainable in which a signal is only produced on simultaneous irradiation of the photosensitive semiconductor body 1 by both radiation sources 2 and 3.

In this case also the auxiliary radiation source 2 and the photosensitive semiconductor body 1 together form a radiation detector for the radiation 13 and preferably are combined to form an integral structure. The radiation source 3 may be any radiation source the radiation 13 of which is to be detected.

The radiation source 2 may again be a tungsten ribbon lamp combined with a monochromatic filter, for example, an interference filter.

The radiation source 2 may alternatively be an injection recombination radiation source, which may include a semiconductor body of gallium arsenide which contains a p-n junction and has a forbidden band of a width of about 1.26 electron-volts and in which recombination radiation having a wavelength of about 9100 A. is obtainable at room temperature. A p-n junction may be produced in an n-type gallium arsenide body, for example, by fusing indium containing about 3% by weight of zinc to the body at a temperature between 500° C. and 700° C., a substantially ohmic connecting contact being obtained by fusing tin onto the body at the same temperature. The p-n junction may alternatively be obtained by diffusion of zinc into the n-type gallium arsenide body at about 900° C. The semiconductor body of the radiation source 2 may also consist of indium phosphide which has a width of the forbidden band approximately between 1.3 electron-volts and 1.4 electron-volts and in which recombination radiation is obtainable which has approximately the same wavelength as in the case of a semiconductor body made of gallium arsenide.

The semiconductor body of gallium arsenide or indium phosphide may form an integral structure with the photosensitive semiconductor body 1 made of gallium phosphide and may be provided on the photosensitive semiconductor body 1, for example, by an epitaxial method commonly used in the semiconductor art.

It will be appreciated that the invention is not restricted to the embodiment described and that a person skilled in the art may make many modifications without departing from the scope of the invention. For example, in the embodiments so far described the photosensitive semiconductor body has an intermediate energy level in the forbidden band which is not occupied by electrons when the semiconductor body is not irradiated, while electrons can be brought by optical agency from the valence band to the intermediate energy level and subsequently, by optical agency also, from this intermediate energy level to the conduction band. As a result electrons are brought from the valence band to the conduction band so that the photosensitive semiconductor body may take the form of a photovoltaic cell. Alternatively, however, a photosensitive semiconductor body may be used which has an intermediate energy level in the forbidden band which is occupied by electrons. In this case electrons can be brought by optical agency from the intermediate energy level to the conduction band and subsequently electrons from the valence band to the intermediate energy level. As a result, in this case also electrons are brought from the valence band to the conduction band in two transition steps by way of the intermediate energy level. Furthermore it is possible for the photosensitive semiconductor body to be doped only locally with an impurity which induces the intermediate energy level so that radiation which is capable of producing either of the two transition steps but has a wavelength corresponding to energy smaller than the width of the forbidden band can only be absorbed at predetermined desired locations. Furthermore it is not necessary for the photosensitive semiconductor body to contain a p-n junction but this body may take the form, for example, of a photo-resistance cell. A surface of a semiconductor body to be irradiated, for example, the semiconductor body 1 of FIG. 1, may be provided with an antireflection layer commonly used in optics.

What is claimed is:

1. A detector for external radiation comprising a body of a photosensitive semiconductor material having valence and conduction bands separated by a forbidden bandgap and within the bandgap an impurity level defining a first electron transition step between the valence band and the impurity level and a second electron transition step between the impurity level and the conduction band, connections to said body to form an output circuit, a radiation source for irradiating the photosensitive body with one radiation having a principal energy content capable of causing one of the first and second electron transition steps, said external radiation to be detected having a principal energy content capable of causing the other of the first and second electron transition steps, said body being positioned to receive the said external radiation while simultaneously receiving said one radiation thus raising electrons to the conduction band and increasing the electrical output in the circuit, and means in the output circuit for indicating the increase of the electrical output as an indication of the intensity of said external radiation.

2. A detector as set forth in claim 1 wherein the radiation source is an injection recombination radiation source integral with the photosensitive semiconductor body.

3. A detector as set forth in claim 2 wherein one of the first and second transition steps is larger than the other, and the radiation from the integral radiation source causes said larger transition whereas the external radiation can only cause the smaller transition.

4. A detector as set forth in claim 2 wherein one of the first and second transition steps is larger than the other, and the external radiation causes said larger transition whereas the radiation from the integral radiation source can only cause the smaller transition.

5. A detector for external radiation comprising a body of a photosensitive semiconductor material having valence and conduction bands separated by a forbidden bandgap and within the bandgap a deep-lying impurity level defining a first electron transition step between the valence band and the impurity level and a second electron transition step between the impurity level and the conduction band, a portion of said body being of n-type conductivity and an adjacent portion of said body being of p-type conductivity forming with the n-type portion a p-n junction, the impurity level being far enough above the valence band so that it will be substantially unoccupied in the absence of external radiation, connections to said p-type and n-type portions to form an output circuit, an internal radiation source for irradiating the photosensitive body with one radiation having a principal energy content capable of causng one of the first and second transition steps, said external radiation to be detected having a principal energy content capable of causing the other of the first and second electron transition steps, said external radiation being insufficient to cause direct electron transitions from the valence to the conduction band, said body being positioned to receive the said external radiation while simultaneously receiving said one radiation thus raising electrons to the conduction band and increasing the electrical output in the circuit, and means in the output circuit for indicating the increase of the electrical output as an indication of the intensity of said external radiation.

6. A detector as set forth in claim 5 wherein the impurity level is spaced at least 0.1 electron-volt from both the valence and conduction bands.

7. A detector as set forth in claim 6 wherein the photosensitive semiconductor material has a body portion constituted of gallium phosphide doped with zinc and oxygen.

8. A detector as set forth in claim 22 wherein the radiation source comprises a semiconductor body portion of gallium phosphide doped with zinc and oxygen.

9. A detector as set forth in claim 7 wherein the radiation source comprises a semiconductor body portion of gallium arsenide or indium phosphide.

10. A detector as set forth in claim 6 wherein the photosensitive semiconductor material has a body portion constituted of aluminum phosphide.

References Cited

UNITED STATES PATENTS

| | | | |
|---|---|---|---|
| 3,102,201 | 8/1963 | Braunstein et al. | 250—211 |
| 3,358,146 | 12/1967 | Ing et al. | 250—217 |
| 3,324,297 | 6/1967 | Stieltjes et al. | 317—235 X |
| 3,283,160 | 11/1966 | Levitt et al. | 317—235 X |

WALTER STOLWEIN, *Primary Examiner.*

U.S. Cl. X.R.

250—211; 317—235